United States Patent
Berliner et al.

(10) Patent No.: US 9,018,024 B2
(45) Date of Patent: Apr. 28, 2015

(54) CREATING EXTREMELY THIN SEMICONDUCTOR-ON-INSULATOR (ETSOI) HAVING SUBSTANTIALLY UNIFORM THICKNESS

(75) Inventors: Nathaniel C. Berliner, Albany, NY (US); Kangguo Cheng, Albany, NY (US); Jason E. Cummings, Albany, NY (US); Toshiharu Furukawa, Essex Junction, VT (US); Jed H. Rankin, Essex Junction, VT (US); Robert R. Robison, Essex Junction, VT (US); William R. Tonti, Essex Junction, VT (US)

(73) Assignee: International Business Machines Corporation, Armonk, NY (US)

(*) Notice: Subject to any disclaimer, the term of this patent is extended or adjusted under 35 U.S.C. 154(b) by 403 days.

(21) Appl. No.: 12/603,668

(22) Filed: Oct. 22, 2009

(65) Prior Publication Data
US 2011/0095393 A1 Apr. 28, 2011

(51) Int. Cl.
*H01L 21/66* (2006.01)
*H01L 21/762* (2006.01)
*H01L 21/306* (2006.01)

(52) U.S. Cl.
CPC ...... *H01L 21/7624* (2013.01); *H01L 21/30625* (2013.01); *H01L 22/12* (2013.01); *H01L 22/20* (2013.01); *H01L 2924/0002* (2013.01); *Y10S 438/959* (2013.01)

(58) Field of Classification Search
CPC ..... H01L 22/20; H01L 21/265; H01L 21/302; H01L 21/76819; H01L 21/76825; H01L 21/7684
USPC ........... 438/207, 218, 219, 294, 427, 14, 369, 438/692, 505, 506, 959; 257/48, 347, 257/E21.521, E27.112, E21.545, E21.561
See application file for complete search history.

(56) References Cited

U.S. PATENT DOCUMENTS

| | | | |
|---|---|---|---|
| 5,154,023 A * | 10/1992 | Sioshansi | ........................ 451/41 |
| 5,834,816 A | 11/1998 | Jang | |
| 6,229,184 B1 | 5/2001 | Riccobene | |
| 6,537,606 B2 * | 3/2003 | Allen et al. | ...................... 427/9 |
| 6,551,886 B1 | 4/2003 | Yu | |
| 6,599,840 B2 | 7/2003 | Wu et al. | |
| 6,927,146 B2 | 8/2005 | Brask et al. | |

(Continued)

OTHER PUBLICATIONS

Allen et al., SOI Uniformity and Surface Smoothness Improvement Using GCIB Processing, 2002 IEEE International SOI Conference, Oct. 2002, pp. 192-193.*
Ziskind, U.S. Appl. No. 12/603,737, Office Action Communication, Jan. 6, 2011, 24 pages.
Eryu et al., "Nanostructure formation of SIC using ion implantation and CMP", Nuclear Instruments and Methods in Physics Research, B 242 (2006), 237-239.

(Continued)

*Primary Examiner* — David Vu
(74) *Attorney, Agent, or Firm* — Anthony J. Canale; Hoffman Warnick LLC

(57) ABSTRACT

An extremely thin semiconductor-on-insulator (ETSOI) wafer is created having a substantially uniform thickness by measuring a semiconductor layer thickness at a plurality of selected points on a wafer; determining a removal thickness to be removed at each of the plurality of selected points such that removal of the removal thickness results in a substantially uniform within-wafer semiconductor layer thickness; implanting a species into the wafer at each of the plurality of selected points with at least one of a dose level and an energy level based on the removal thickness for the respective point; and polishing the semiconductor layer to thin the semiconductor layer.

12 Claims, 4 Drawing Sheets

(56) References Cited

U.S. PATENT DOCUMENTS

| | | | |
|---|---|---|---|
| 7,087,475 B2 | 8/2006 | Inoh | |
| 7,202,123 B1 | 4/2007 | Pan | |
| 7,265,054 B2 * | 9/2007 | Choi et al. | 438/690 |
| 7,320,929 B2 | 1/2008 | Aga et al. | |
| 7,407,868 B2 | 8/2008 | Brask et al. | |
| 7,767,583 B2 * | 8/2010 | Ramappa et al. | 438/705 |
| 7,804,151 B2 | 9/2010 | Brown et al. | |
| 2003/0235959 A1 | 12/2003 | Lichtenberger et al. | |
| 2004/0121531 A1 | 6/2004 | Wieczorek et al. | |
| 2004/0248348 A1 | 12/2004 | Rausch et al. | |
| 2006/0279844 A1 | 12/2006 | Maeno | |
| 2007/0057307 A1 | 3/2007 | Shum et al. | |
| 2007/0069335 A1 | 3/2007 | Endo et al. | |
| 2007/0145481 A1 | 6/2007 | Tilke et al. | |
| 2007/0177874 A1 | 8/2007 | Kashima et al. | |
| 2007/0251105 A1 | 11/2007 | Takada | |
| 2007/0277874 A1 | 12/2007 | Dawson-Elli et al. | |
| 2007/0281105 A1 | 12/2007 | Mokhlesi et al. | |
| 2008/0299686 A1 * | 12/2008 | Kobayashi et al. | 438/16 |
| 2011/0095366 A1 | 4/2011 | Abadeer et al. | |
| 2011/0097824 A1 | 4/2011 | Berliner et al. | |
| 2012/0098087 A1 | 4/2012 | Abadeer et al. | |
| 2013/0200486 A1 | 8/2013 | Chatty et al. | |

OTHER PUBLICATIONS

Luu, U.S. Appl. No. 12/603,671, Office Action Communication, May 12, 2011, 21 pages.

Ziskind, U.S. Appl. No. 12/603,737, Office Action Communication, Jul. 12, 2011, 12 pages.

Ziskind, U.S. Appl. No. 12/603,737, Notice of Allowance & Fees Due, Oct. 5, 2011, 22 pages.

Luu, Chuong A., U.S. Appl. No. 12/603,671, Notice of Allowance and Fees Due, Oct. 5, 2011, 20 pages.

U.S. Appl. No. 13/342,423, filed Jan. 23, 2012, Office Action dated Aug. 16, 2012.

Yechuri: U.S. Appl. No. 13/342,423, Final Office Action Nov. 26, 2012, 23pgs.

Yechuri, Sitaramarao S., U.S. Appl. No. 13/835,463, Office Action Sep. 12, 2014, 21 pgs.

U.S. Appl. No. 12/603,668, Appendix P, "List of IBM Patents or Patent Applications Treated as Related," 2 pgs.

Luu, Chuong A., U.S. Appl. No. 13/359,970, Notice of Allowance, Sep. 15, 2014, 8 pgs.

Luu, Chuong A., U.S. Appl. No. 13/359,970, Office Action, May 9, 2014, 9 pgs.

* cited by examiner

CREATING EXTREMELY THIN SEMICONDUCTOR-ON-INSULATOR (ETSOI) HAVING SUBSTANTIALLY UNIFORM THICKNESS

BACKGROUND

1. Technical Field

The disclosure relates generally to semiconductor wafer fabrication, and more particularly, to a method of creating an extremely thin semiconductor-on-insulator (ETSOI) layer to have a substantially uniform thickness across the wafer.

2. Background Art

Complementary metal-oxide semiconductor (CMOS) devices built on an extremely thin semiconductor-on-insulator (SOI) substrate have been one of the viable options for continued scaling of CMOS technology to the 22 nm node and beyond. Device characteristics such as threshold voltage (Vt) of an ETSOI device are mainly determined by the thickness of ETSOI. Consequently, SOI thickness variation within a wafer strongly contributes to Vt variation. For the 22 nm node and beyond, the SOI thickness requirement may be about 10 nm or thinner. Currently, SOI wafers are generated having thicknesses that are significantly thicker than 60 nm, and are then thinned to the ETSOI level. One current wafer thinning technique includes oxidizing the bonded or SIMOX (i.e., separated by implantation of oxygen) SOI in a furnace and wet etching the oxide. This approach transfers the within-wafer variation of the initial SOI thickness to the ETSOI. Unfortunately, the resulting thickness variation remains too large for the desired 22 nm devices. In one example, the thickness variation may range +/−20 angstroms (Å) for an initially 700 Å SOI wafer. Other approaches that use ion beam etching to thin the SOI layer result in too extensively damaged wafers to be practicable.

BRIEF SUMMARY

A first aspect of the disclosure provides a method comprising: measuring a semiconductor layer thickness at a plurality of selected points on a wafer; determining a removal thickness to be removed at each of the plurality of selected points such that removal of the removal thickness results in a substantially uniform within-wafer semiconductor layer thickness; implanting a species into the wafer at each of the plurality of selected points with at least one of a dose level and an energy level based on the removal thickness for the respective point; and polishing the semiconductor layer to thin the semiconductor layer.

A second aspect of the disclosure provides a system comprising: a measurer for measuring a semiconductor layer thickness at a plurality of selected points on a wafer; a processor for determining a removal thickness to be removed at each of the plurality of selected points such that removal of the removal thickness results in a substantially uniform within-wafer semiconductor layer thickness; an ion implanter for implanting a species into the wafer at each of the plurality of selected points with at least one of a dose level and an energy level based on the removal thickness for the respective point; and a chemical mechanical polishing system for polishing the semiconductor layer to thin the semiconductor layer.

A third aspect of the disclosure provides a wafer comprising: a substrate including silicon; a buried insulator layer over the substrate; and an extremely thin semiconductor-on-insulator (ETSOI) layer over the buried insulator layer, the ETSOI layer having a thickness of no greater than approximately 80 angstroms and a tolerance of no greater than approximately 8 angstroms across the wafer.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Figure 1:
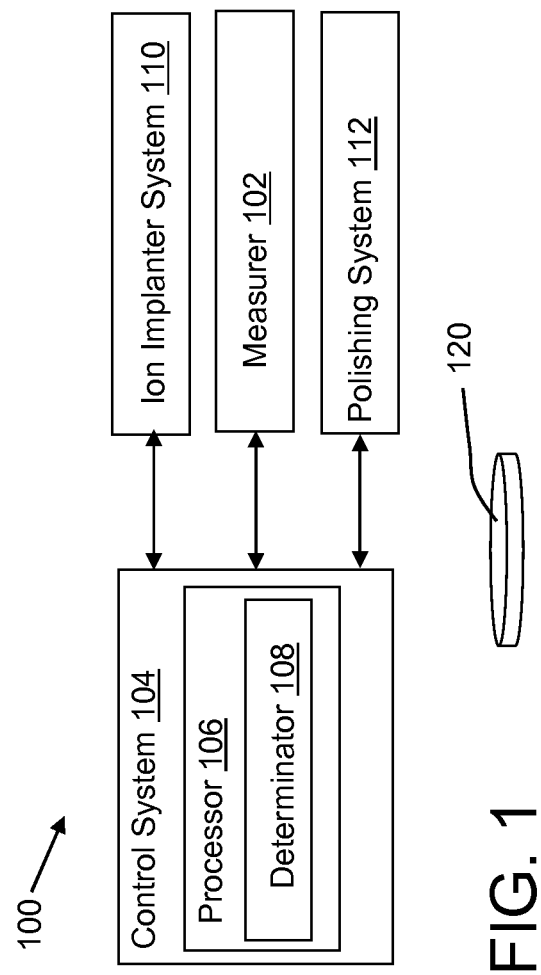
FIG. 1 shows a block diagram of a system according to embodiments of the invention.

Referring to the drawings, FIG. 1 shows a block diagram of a system 100 according to embodiments of the invention. System 100 includes a measurer 102, a control system 104 including a processor 106, an ion implanter system 110 and a polishing system 112.

Measurer 102 may include any now known or later developed system for measuring the topography of a surface, such as a semiconductor wafer 120, and obtaining a semiconductor layer thickness at a plurality of selected points on wafer 120. For example, measurer 102 may include an interferometry-based device such as ellipsometry or a scanning microscope such as a scanning electron microscope (SEM) or atomic force microscope (AFM), etc. Ion implanter system 110 may include any now known or later developed ion implanter system capable of dynamically controlled, across-wafer energy or dose (scan speed) variation, e.g., an infusion gas cluster ion implanter system or a spot beam ion implanter system. One illustrative ion implanter system capable of such functioning is a Quantum X model (scanning ion beam), available from Applied Materials of Santa Clara, Calif. Polishing system 112 may include any now known or later developed system capable of removing layers of solid by chemical mechanical polishing (CMP) carried out for the purpose of surface planarization and definition of metal interconnect patterns.

System 100 also includes a control system 104 for controlling measurer 102, ion implanter system 110, polishing system 112 and any interconnecting systems, either directly or through interaction with internal controllers of those components. Control system 104 may include any now known or later developed processor-based machine control system. In addition, processor 106 includes a determinator 108, the function of which will be described in greater detail elsewhere herein.

As will be appreciated by one skilled in the art, control system 104 may be embodied as a system or computer program product. Accordingly, control system 104 may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, control system 104 may take the form of a computer program product embodied in any tangible medium of expression having computer-usable program code embodied in the medium.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out operations of control system 104 may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Operation of control system 104 is described with reference to the other figures that illustrate methods, apparatus (systems) and computer program products according to embodiments of the invention. It will be understood that control of measurer 102, ion implanter system 110, polishing system 112, processor 106 and any other systems or functions necessary for operation of system 100 may be implemented by computer program instructions. These computer program instructions may be provided to a processor (e.g., 106) of a general purpose computer, special purpose computer, or other programmable data processing apparatus to produce a machine, such that the instructions, which execute via the processor of the computer or other programmable data processing apparatus, create means for implementing the functions/acts specified herein.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks. The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

Figure 2:
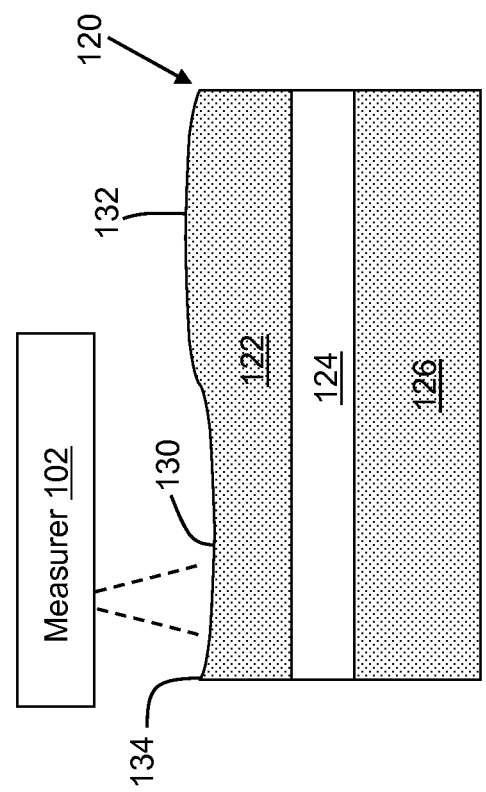
FIG. 2 shows a measuring process according to embodiments of the invention.
Figure 4:
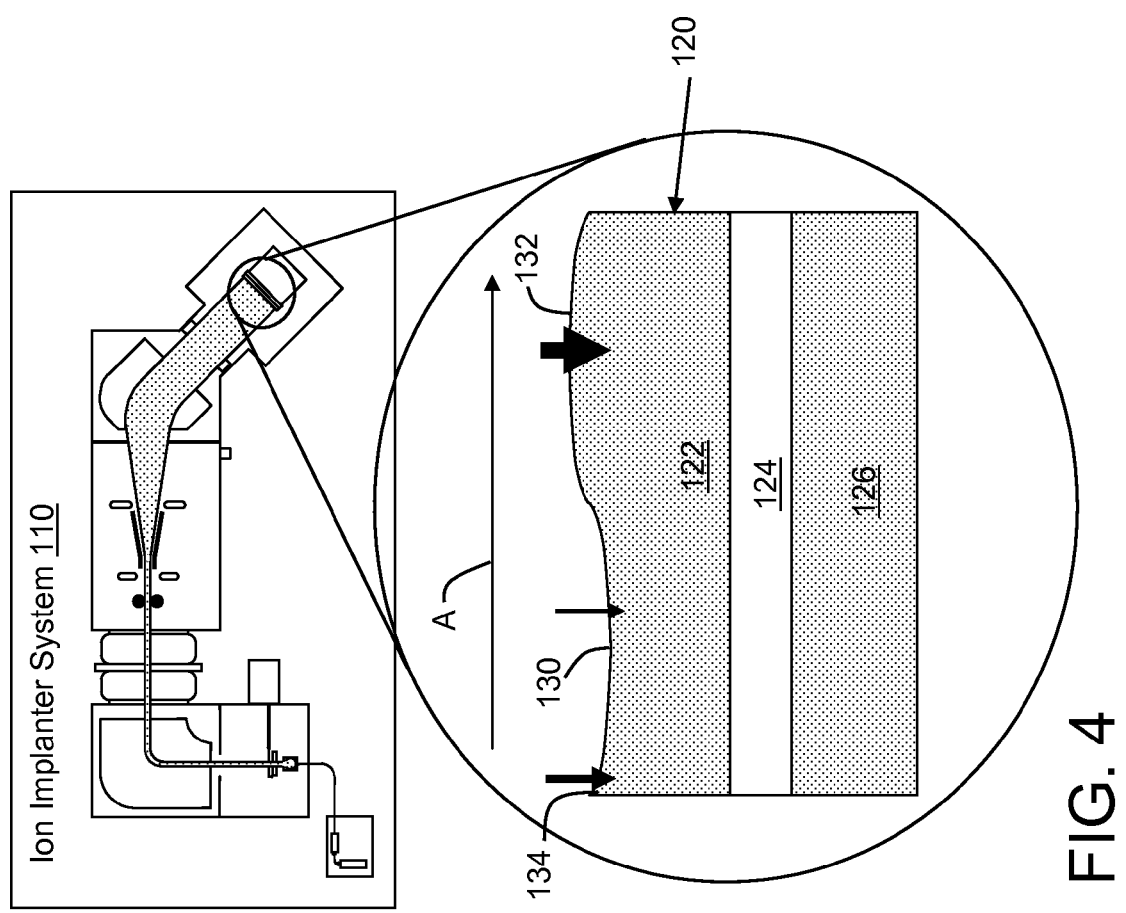
FIG. 4 shows an implanting process according to embodiments of the invention.
Figure 5:
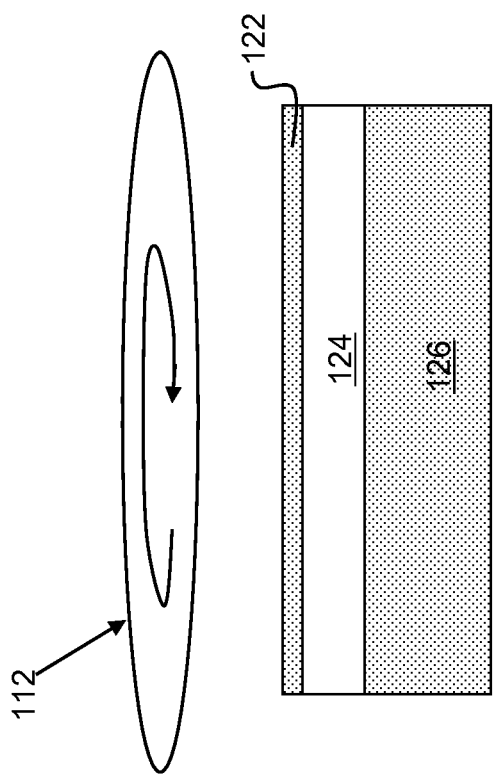
FIG. 5 shows a polishing process according to embodiments of the invention.

In one embodiment, as shown in FIGS. 2, 4 and 5, wafer 120 includes a semiconductor-on-insulator (SOI) wafer comprising a semiconductor-on-insulator (SOI) layer 122, a buried insulator layer 124 and a substrate layer 126. As understood, SOI layer 122 and substrate layer 126 may include but are not limited to silicon, germanium, silicon germanium, silicon carbide, and those consisting essentially of one or more III-V compound semiconductors having a composition defined by the formula $Al_{X1}Ga_{X2}In_{X3}AS_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable materials include II-VI compound semiconductors having a composition $Zn_{A1}Cd_{A2}Se_{B1}Te_{B2}2$, where A1, A2, B1, and B2 are relative proportions each greater than or equal to zero and A1+A2+B1+B2=1 (1 being a total mole quantity). Furthermore, a portion or entire layer may be strained. Buried insulator layer 124 may include any dielectric material typically used in an SOI wafer, e.g., silicon dioxide. While shown applied to an SOI wafer 120, teachings of the invention are also applicable to other types of substrates, e.g., a bulk semiconductor layer or substrate.

Figure 3:
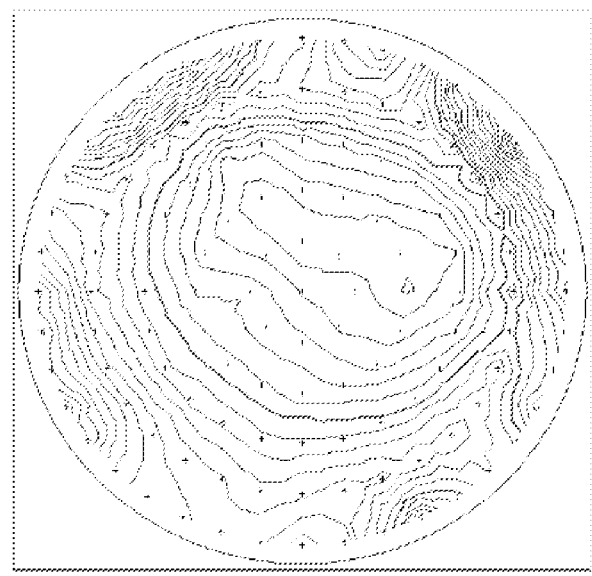
FIG. 3 shows a topographical map of an illustrative wafer based on the measuring process.

Referring to FIGS. 2-6, one embodiment of an operational methodology of system 100 will now be described. In a first process, shown in FIG. 2, measurer 102 measures a semiconductor layer thickness at a plurality of selected points on a wafer 120. The number of selected points (or granularity) at which the measurements are made can be user defined, e.g., depending on the size of the wafer or the thickness precision required. The thickness of SOI layer 122 can be determined by measurer 112 using any known technique (e.g., ellipsometry, interferometry, microscopic scanning, etc.) and related computational functions (e.g., determining thickness of a layer from a known reference point or base line). In the setting of an SOI wafer 120, as described herein, the thickness of SOI layer 122 is the semiconductor layer of interest. As illustrated in a simplified, partial form in FIG. 2, wafer 120 initially includes a topography that varies across the wafer, having a low point(s) 130, a high point(s) 132 and any number of intermediate points 134. SOI layer 122 may vary in thickness over a large range, e.g., by 54 angstroms across the wafer from a low point to a high point. FIG. 3 shows a topographical map of an entirety of an illustrative wafer 120 that can be generated by measurer 102 based on the measuring process. The thickness variation across the wafer is shown by the numerous thickness plateaus within the topographical map of FIG. 3. In this state, wafer 120 is incapable of use at the 22 nm technology node due to SOI layer 122 thickness variation. In addition, SOI layer 122 thickness makes wafer 120 too thick for use as an ETSOI wafer.

In a second process, determinator 108 (FIG. 1) determines a removal thickness to be removed at each of the plurality of selected points such that removal of the removal thickness results in a substantially uniform within-wafer semiconductor layer thickness. In one embodiment, determinator 108 may calculate the removal thickness for each of the selected points by subtracting the measured thickness at that point from a desired thickness at that point or for the entire semiconductor layer, e.g., SOI layer 122. Other techniques of calculating the removal thickness may also be employed.

Referring to FIG. 4, ion implanter system 110 is used to implant a species into wafer 120 at each of the plurality of selected points with at least one of a dose level and an energy level based on the removal thickness for the respective point. The species implanted may include any element(s) that increases the polishing rate of the semiconductor layer, i.e., SOI layer 122. In one embodiment, the species may include an inert gas such as argon (Ar) or xenon (Xe). In other embodiments, the species may include germanium (Ge) or silicon (Si). The dose level and/or energy level may be dynamically varied during the scanning of an ion beam across wafer 120, as indicated by arrow A in FIG. 4. In this fashion, the dose level and/or energy level is made higher for points at which the removal thickness is greater, and is made lower at points at which the removal thickness is lower. The different dose and/or energy levels results in different amorphization levels across wafer 120 and, hence, different polishing rates across wafer 120 depending on the required removal thickness. The dose and/or energy level is indicated by the thickness of arrows at points 130, 132, 134. As illustrated, high point(s) 132 receive a higher ion implant dose or energy (thicker vertical arrow) than low point(s) 130 (thinnest vertical arrow) and intermediate points 134 (intermediate vertical arrow), creating a polishing rate at each point commensurate with a removal thickness at the respective point. In alternative embodiments, the different doses and/or energy levels can be obtained by using more than one scan of the ion beam.

FIG. 5 shows polishing system 112 polishing the semiconductor layer, i.e., SOI layer 122, to thin the semiconductor layer. In one embodiment, the polishing includes performing chemical mechanical polishing (CMP); however, other polishing techniques may be employed. The polishing may also be selectively applied to the plurality of selected points.

Figure 6:
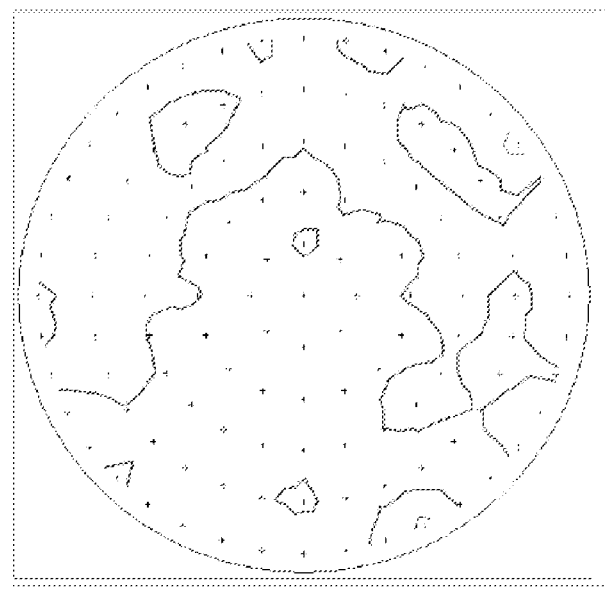
FIG. 6 shows a topographical map of the illustrative wafer after the polishing process.

The above-described methodology results in a finished wafer including substrate 126, buried insulator 124 and an extremely thin SOI (ETSOI) layer 122 over the buried insulator layer 124, where the SOI layer has a thickness of no greater than approximately 80 angstroms and a tolerance of no greater than approximately 8 angstroms across the wafer. Hence, SOI layer 122 has a thickness in the 'extremely thin' range, and a substantially uniform thickness beneficial for use at the 22 nm technology node. FIG. 6 shows a topographical map of an entirety of an illustrative wafer 120 as generated by measurer 102 after the above-described methodology. The thickness variation across the wafer is substantially uniform as illustrated by the reduced number of thickness plateaus within the topographical map compared to those of FIG. 3. In this state, wafer 120 is capable of use as an ETSOI wafer at the 22 nm technology node.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method comprising:
   measuring a semiconductor layer thickness at a plurality of selected points on a wafer;
   determining a removal thickness to be removed at each of the plurality of selected points, wherein the removal thickness is different for each of the plurality of selected points and comprises the amount required to be removed at each selected point in order to result in a substantially uniform within-wafer semiconductor layer thickness;
   implanting a species into the wafer at each of the plurality of selected points with a different dose level and a different energy level for each of the plurality of selected points based on the removal thickness for each of the plurality of selected points; and
   polishing the semiconductor layer to thin the semiconductor layer, wherein the implanting results in a different polishing rate for each of the plurality of selected points resulting in a substantially uniform thickness of the semiconductor layer.

2. The method of claim 1, wherein the species includes an inert gas.

3. The method of claim 1, wherein the species is selected from the group consisting of: germanium (Ge), silicon (Si), argon (Ar), xenon (Xe).

4. The method of claim 1, wherein the thinning results in the semiconductor layer having a thickness of no more than approximately 40 angstroms.

5. The method of claim 1, wherein the semiconductor layer is a semiconductor-on-insulator (SOI) layer of a SOI wafer.

6. The method of claim 1, wherein the implanting includes using an infusion gas cluster ion implanter system.

7. The method of claim 1, wherein the implanting includes using a spot beam ion implanter system.

8. The method of claim 1, wherein the polishing includes performing chemical mechanical polishing (CMP).

9. The method of claim 1, wherein the measuring includes scanning the wafer using an interferometry-based device.

10. The method of claim 1, further comprising: generating a topographical map indicating thicknesses across the wafer based on the measuring.

11. The method of claim 1, wherein the determining includes calculating the removal thickness for each of the selected points by subtracting the measured thickness at each point from a desired thickness.

12. The method of claim 1, wherein the removal thickness is expressed as a topographical map indicating removal thickness across the wafer.

* * * * *